United States Patent
Ma et al.

[11] Patent Number: 6,011,404
[45] Date of Patent: Jan. 4, 2000

[54] SYSTEM AND METHOD FOR DETERMINING NEAR—SURFACE LIFETIMES AND THE TUNNELING FIELD OF A DIELECTRIC IN A SEMICONDUCTOR

[75] Inventors: Yi Ma; Pradip K. Roy, both of Orlando, Fla.

[73] Assignee: Lucent Technologies Inc., Murray Hill, N.J.

[21] Appl. No.: 08/887,861

[22] Filed: Jul. 3, 1997

[51] Int. Cl.[7] .......................... G01R 31/26; G01N 27/60
[52] U.S. Cl. ............................................ 324/765; 324/455
[58] Field of Search ................................... 324/767, 765, 324/158.1, 769

[56] References Cited

U.S. PATENT DOCUMENTS

| | | | |
|---|---|---|---|
| 4,812,756 | 3/1989 | Curtis et al. | 324/158 |
| 5,216,362 | 6/1993 | Verkuil | 324/158 |
| 5,485,091 | 1/1996 | Verkuil | 324/765 |
| 5,498,974 | 3/1996 | Verkuil et al. | 324/767 |
| 5,661,408 | 8/1997 | Kamieniecki et al. | 324/752 X |
| 5,773,989 | 6/1998 | Edelman et al. | 324/765 |
| 5,834,941 | 11/1998 | Verkuil | 324/753 X |

OTHER PUBLICATIONS

Bickley, "Quantox (TM)—Non–contact Oxide Monitoring System", Keithley Instruments, Inc., 1995 No Month.

*Primary Examiner*—Josie Ballato
*Assistant Examiner*—T. R. Sundaram

[57] ABSTRACT

The present invention is directed to a system for, and method of, determining a non-contact, near-surface generation and recombination lifetimes and near surface doping of a semiconductor material. The system includes: (1) a radiation pulse source that biases a dielectric on top of the semiconductor material, (2) a voltage sensor to sense the surface voltage, and (3) a photon source to create carriers. For lifetime measurements both the excitation and measurement signals are time dependent and may be probed near the surface of the semiconductor to obtain various electrical properties. For high-field tunneling and leakage characteristics of a thin dielectric (<15 nm) on top of the semiconductor, a high bias charge density is used to induce tunneling, from which tunneling fields and charge-fluence to tunneling of the dielectric are determined.

30 Claims, 7 Drawing Sheets

SYSTEM AND METHOD FOR DETERMINING NEAR— SURFACE LIFETIMES AND THE TUNNELING FIELD OF A DIELECTRIC IN A SEMICONDUCTOR

TECHNICAL FIELD OF THE INVENTION

The present invention is directed, in general, to integrated circuit fabrication and testing and, more specifically, to a system and method for determining near-surface generation and recombination lifetimes, near surface doping in semiconductor material and tunneling voltage of a dielectric material.

BACKGROUND OF THE INVENTION

The worldwide use and methods of manufacturing semiconductors have reached phenomenal proportions over the last decade. Equally phenomenal has been the ever decreasing device size of the semiconductors in general. The on-going trends toward larger wafers, shrinking line widths, and ever thinner oxides are making tight in-line monitoring of wafer cleanliness and uniformity even more critical to semiconductor manufacturers. Contaminants can be any form of matter that causes unintentional changes in electrical properties of semiconductor devices. Some common contaminants include particles, atomic-ionic-molecular defects, and heavy metals.

To prevent contaminants from affecting device performance, a modern fabrication house may involve cleaning steps to remove such contaminants. From a device standpoint, the amount of electrically active impurities in oxides must be minimized because embedded impurities attract or repel free charges in the underlying silicon. In most cases, device performance depends strongly on the concentration of free charges in the silicon, and variations in electrical oxide contamination will usually introduce unwanted variations in device performance. Thus, it is very important to monitor these contaminants and attempt to eliminate them as much as possible from the environment in which the semiconductors are manufactured.

Capacitance-Voltage ("C-V") testing is probably the best known method for detecting oxide processing problems in terms of its charge states and impurities, and for qualifying processes and equipment. Capacitance-Voltage testing is based on measuring the metal oxide silicon ("MOS") capacitance as a function of applied bias to gain important information about the quality and reliability of gate oxides. By performing C-V analysis under temperature and electrical stress, a mobile ion ($Q_m$) charge component may also be measured separately. However, while C-V techniques are well known and relatively low cost in equipment, the procedure suffers from the disadvantage that the process has a slow test turnaround time, largely due to the added aluminum evaporation or photolithographic patterning required for the test capacitor sample, which slows down production. In addition, these extra steps may actually change the electrical properties of the dielectric due to metal/dielectric reaction and formation of the poly-silicon depletion layer, during MOS capacitor fabrication. Furthermore, for thinner oxide (<30 nm), the C-V technique is problematic due to processing damage induced by sputtering and annealing out the defects. Moreover, the creation of contacts makes reclaiming monitor semiconductor wafers difficult, time-consuming and expensive. Consequently, these wafers are often scrapped after completion of testing, which may significantly increase the materials cost for C-V testing. C-V tests along with J-V and reliability tests have a strong history and demonstrated relevance for oxide quality and end-of-line device performance and reliability. However, because of the time required for such testing, the information obtained from these tests is not available at the desirable time during the fabrication process, for example after gate oxidation.

Corona Oxide Semiconductor ("COS") wafer testing is one of the most promising new techniques on the horizon because it addresses many of the concerns related to C-V testing. This technique requires no physical contact to the wafer, so C-V-like data can be obtained without the added processing time and cost associated with forming MOS contacts. With the C-V technique, test contacts must be applied through a metallization step (or, alternatively, a polysilicon deposition process) before testing. This involves the use of an evaporation mask and an additional anneal step. In addition to increasing the processing time required, these steps erase static charge fingerprints from the wafer, which can provide valuable clues to processing problems. The extra steps required also mean the testing cycle may take from one shift to two days to complete. This difference in time required to perform COS-based test techniques versus traditional C-V-based tests translates into a reduction in process monitoring costs. Furthermore, COS can provide nine-point wafer maps in minutes, while C-V processing often takes hours or days to complete before testing can be started. Therefore, COS also provides a higher fabrication equipment utilization rate, which lowers the overall cost of production. Other benefits include the elimination of additional processing steps, which can mask the original charge conditions, and the capability to reuse the wafer after the induced charge is removed by standard cleaning processes or a deionized water rinse.

In conventional COS, a variety of charge-trapping parameters of the dielectric can be measured, such as the level of mobile charge contamination ($Q_m$), the degree of density of interface traps ($D_{it}$) and the flatband voltage ($V$)$/_{fb}$. These charge-trapping characteristics of the dielectric are important parameters. However, there is a strong demand for non-contact measurements of tunneling and charge-fluence characteristics of these dielectrics to complete the established metrics for dielectrics. The quality of these dielectrics are also strongly coupled to the near-surface defect/impurity characteristics of the semiconductor material (e.g., silicon) underneath.

SUMMARY OF THE INVENTION

To address the above-discussed deficiencies of the prior art, the present invention provides a method of determining electrical properties of a semiconductor material. In one embodiment the method comprises the steps of: (1) field inducing a junction in equilibrium inversion in the semiconductor material, (2) pulsing the junction out of equilibrium to create a deep depletion region proximate the junction, (3) measuring a surface voltage proximate the junction while performing the step of pulsing, and (4) determining a generation lifetime of the semiconductor material wherein the generation lifetime is a function of a rate of change of the surface voltage.

In another aspect, the present invention also provides a method for determining a recombination lifetime of the semiconductor material, and the method further comprises the steps of measuring a surface photovoltage proximate the junction while performing a step of bombarding the semiconductor material with a photon source, wherein the recombination lifetime is a function of a rate of change of the surface photovoltage. In another aspect of this particular embodiment the method further includes the step of determining a near-surface doping of the semiconductor material from the recombination lifetime.

In yet another aspect the present invention provides a noncontact method for determining high-field tunneling characteristics of a dielectric material on top of a semiconductor which comprises the steps of electrically biasing the dielectric on top of the semiconductor material to a surface voltage where tunneling begins to dissipate a deposited charge on the semiconductor material, and determining a tunneling field of the dielectric from the surface voltage. In another aspect of this particular embodiment, the method may also include the step of determining a charge fluence or high-field oxide leakage from the on set of tunneling.

The present invention therefore introduces the broad concept of determining the generation and recombination lifetimes, near surface doping of a semiconductor material, the tunneling field, and charge fluence of the dielectric on top of the semiconductor material without necessarily physically contacting the dielectric material. Neither the radiation source nor voltage sensor physically touches the dielectric material, thereby avoiding the detrimental affects brought about in the prior art. Instead, electromagnetic fields are created and electrical charges caused to drift and collect on the surface of the dielectric material to allow the above-discussed electrical properties to be determined.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present invention provides a system and method of determining electrical properties of a semiconductor/dielectric structure, such as tunneling voltage ($V_{tun}$), and hence the tunneling field ($E_{tun}$) of various dielectrics and near-surface lifetimes, including generation ($\tau_G$) and recombination ($\tau_R$), and near-surface doping ($N_{surf}$) in the semiconductor on which the dielectric is formed.

The technique of the present invention uses a combination of charge deposition, non-contact voltage measurement, and surface photovoltage response to build a quasi-static sweep similar to that from a low frequency C-V plotter. The method of the present invention employs the above-discussed corona oxide semiconductor (COS) technique. Charge-pulsed measurements are also possible with COS, and it has been found that these charge-pulsed measurements can be used to measure near-surface doping and minority carrier generation lifetime in a fashion similar to pulsed MOS analysis.

Figure 1:
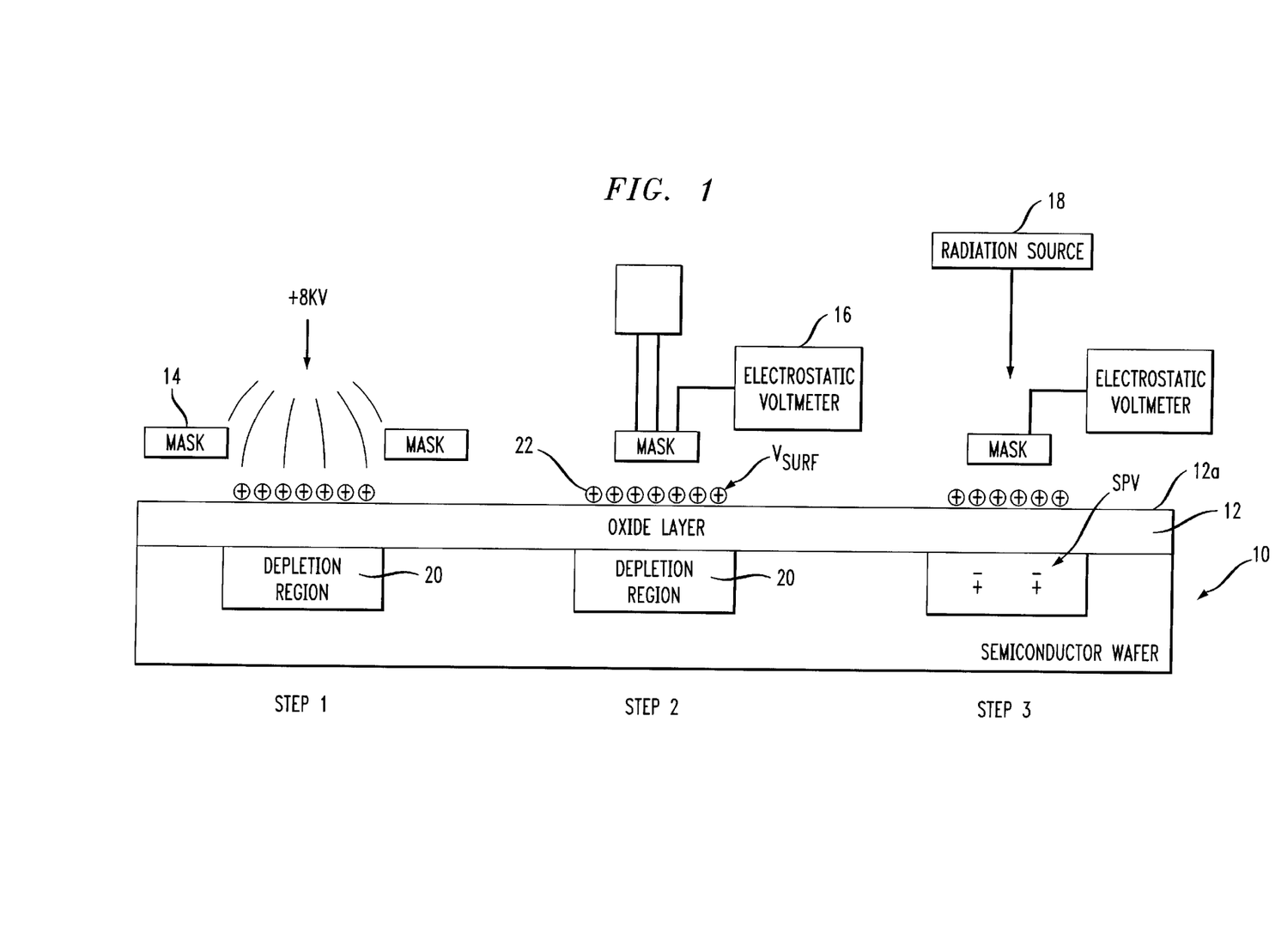
FIG. 1 illustrates schematic diagram of a cross-sectional view of a semiconductor having a dielectric deposited thereon and a three step COS pulsed sequence.

A typical COS three-step sequence is illustrated in FIG. 1 with each step sequentially designated from "1" to "3." A semiconductor wafer 10 to be tested is grounded and is positioned on the COS device. A thermally grown oxide layer 12 is formed over the top surface of the wafer 10. Disposed over the oxide layer 12 is an apparatus for depositing charge on the surface 12a of the oxide layer 12. In an advantageous embodiment the charge depositing apparatus comprises a corona discharge structure, which is capable of applying a uniform charge on the surface of the semiconductor. The charge deposition is preferably carried out through a mask 14 disposed over the surface of the oxide layer 12. The mask 14 is above the surface 12a to provide a good charging definition uniformity. Measurements may be taken with an electrostatic voltmeter 16, such as a Kelvin probe. For some measurements, it may be desirable to apply photons to the semiconductor wafer 10. In order to facilitate such photon application, the COS device may also include a radiation source 18, such as a light emitting diode, that can be used to propagate photons to the surface of the oxide layer 12.

As illustrated, the sequence basically comprises three steps, which may be repeated as necessary. First, a corona charge $\Delta Q_{corona}$ is applied and measured. The corona charges are deposited on the top surface of the oxide layer 12 to create an inverted surface with a depletion region 20 and a field-induced junction in the semiconductor wafer 10. There are a variety of techniques that may be utilized to achieve this type of charge deposition. By way of example only, the above-described charge deposition may be accomplished by means of a corona discharge. In such instances, the first corona discharge may be used to deposit charges on the top surface 12a of the oxide layer 12 in a first area. A tungsten needle corona discharge gun may be disposed above the oxide layer 12, with the needle connected to a ±8 kV voltage source. The sign of the ±8 kV voltage source controls the sign of the resultant ionized room ambient gas molecules that will be deposited on the oxide layer surface 12a. For the P-type wafer shown in FIG. 1, the sign of the voltage source is positive and the resultant positive ionized ambient gas molecules are deposited on the oxide layer surface 12a through the mask 14. The result of this corona discharge is the deposition of the positive charges 22 onto the oxide layer surface 12a. In this example, a sufficient number of majority carrier holes (i.e., electrons), not shown, migrate to the surface 12a of the semiconductor 10 in order to image the positive charges 22 on the other side of the oxide layer 12 and create a depletion region 20.

After $\Delta Q$ is applied, the electrostatic voltmeter 16 is used to measure a surface voltage ($V_s$). The probe vibration drives the alternating current (AC), which may be mathematically expressed as follows:

$$I_{AC}=[V_s-V_{probe}]dC/dt$$

After $V_s$ is measured, the electrostatic voltmeter 16 is stopped and the oxide surface 12a is radiated with preferably a flash of light from a light emitting diode, and the surface photo-(voltage) SPV is measured, which may be mathematically expressed as follows:

$$\Psi \approx -SPV$$

These three steps may be repeated as necessary to generate the entire Q-V curve from depletion to accumulation.

Figure 2:
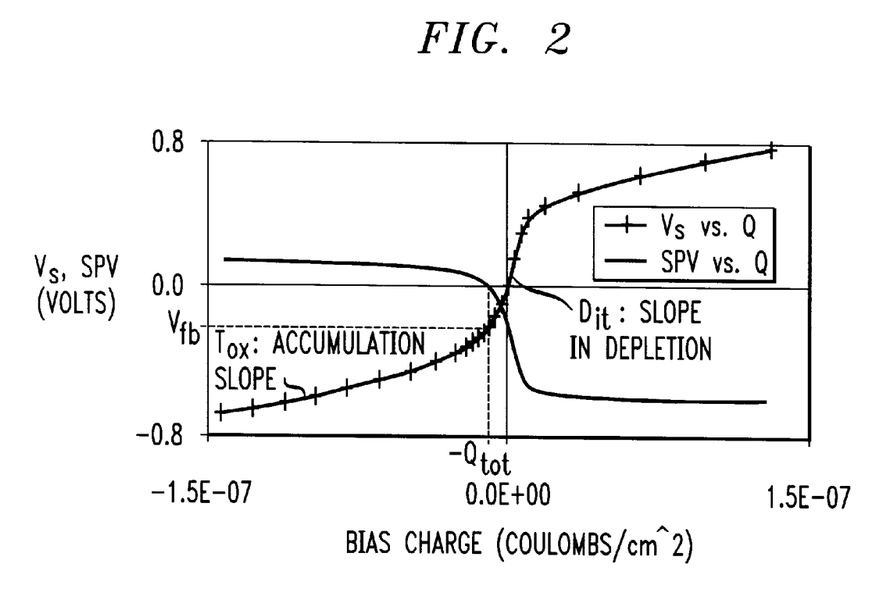
FIG. 2 illustrates a graph of surface voltage and surface photovoltage versus charge of a semiconductor.

Conventional C-V parameters may be extracted from COS data as shown in FIG. 2 which is based on raw data from a 67 ÅSiO$_2$ gate oxide: $T_{ox}=-66.8$Å, $V_{fb}=-0.257$V, $D_{it}=5.29E+10$ eV$^{-1}$cm$^{-2}$, $Q_{tot}=0.74E-8$ C/cm$^2$. The bias charge, which is shown on the x-axis, is generated by the high-impedance room air ionizer (e.g., the corona source). Air molecules are ionized and directed toward the sample surface, and each charge deposition, $\Delta Q$, is measured by a coulomb meter connected in series with the wafer chuck. Typical bias sweeps extend from $-1.5E-7$ to $+1.5E-7$ C/cm$^2$ ($-0.5$ to $+0.5$ MV/cm), and the sweep range is dynamically adjusted to accommodate samples that exhibit high density of interface traps ($D_{it}$).

As explained above, the response of the sample is monitored using surface voltage ($V_s$) and surface photo-voltage (SPV) measurements. After each small charge deposition, $V_s$ is measured by the non-contact electrostatic voltmeter 16. Subsequent to the measurement of $V_s$, a photon source is directed at the wafer. The resultant surface photo-voltage (SPV) is capacitively coupled to the probe, and the signal is analyzed to determine the silicon band bending. The surface voltage at SPV=0 is reported as the flatband voltage; $V_{fb}=V_s|_{\Psi=0}$. The magnitude of charge that is deposited to achieve the flatband condition is defined as a total oxide charge ($-Q_{tot}$).

The electrical oxide thickness ($T_{ox}$) may also be determined from the slope of the Q-V$_s$ curve in accumulation. The procedure includes a second order correction for the equilibrium band-bending to improve accuracy on thin oxides. Dielectrics as thin as 2.0 nm have been measured using this technique with 3σ repeatability at less than 0.07 nm. The technique is significantly simpler than conventional poly-MOSCAP measurements, because there is no poly silicon depletion effect or probe punch-through, and the COS technique is not as sensitive to leakage through oxide pinholes. The oxide resistivity in strong accumulation, $\rho_{ox}$, is also determined, and a quasi-static analysis of the Q-V$_s$ curve yields the density of interface traps ($D_{it}$) using the following Berglund method:

$$D_{it}=1/q[dQ/d\Psi(\text{measured})-dQ/d\Psi(\text{theoretical})]$$

wherein q=electronic charge, $1.6 \times 10^{-19}$C

Q=surface bias charge $\Psi$=band bending dQ=change in surface d$\Psi$=corresponding change in bending The COS technology used in the present invention mimics MOS technology and has parallels with three types of electrical tests: (1) low frequency or quasistatic C-V ($V_{fb}$, $D_{it}$, $Q_M$, $T_{ox}$, etc.; (2) pulsed c-t for $\tau_G$ and $N_{surf}$; and (3) I-V for $E_{tun}$, $V_{tun}$ and charge-fluence in dielectrics. Each of these tests are discussed below in the same order as just stated.

COS is similar to quasistatic, or low frequency, CV. The principal difference is that COS is a non-contact method, whereas CV requires MOSCAP processing. As in the CV technology, COS analysis requires that an electrical bias be applied to the sample to measure the oxide's electrical properties. For CV, this bias is a voltage applied to the MOSCAP through an electrical probe and the response is the measured capacitance. With COS, the bias is applied by charging the oxide surface. The bias, in charge/area, is measured by a coulomb meter attached in series with the chuck. A typical sweep, as shown in FIG. 1, may bias the surface to create an electric field of +/−1 MV/cm$^2$ (the same bias range used in conventional CV testing). The full sweep may be composed of approximately 40 small charge depositions. Two techniques may be used to measure the response of the semiconductor after each charge deposition. The first technique is that the surface voltage ($V_s$) is measured by the non-contact vibrating Kelvin probe. $V_s$ is controlled by the capacitance of the series-connected oxide and silicon. The oxide capacitance is a constant, while the silicon capacitance has an inherent bias dependence due to the semiconducting nature of the silicon. The second technique is that the surface photo-voltage (SPV) is the temporary voltage created when free carriers are photo-injected into the near-surface region of the silicon. In this case, the probe vibration used to measure $V_s$ is turned off, and a high speed light flash is used to photo-generate carriers. A voltage spike caused by the temporary collapse of the near surface band bending is capacitively coupled to the motionless sensor and captured by a high speed A/D converter.

The building blocks described above are used in a repetitive fashion to build a COS data sweep, which includes a deposit charge, Q, a $V_s$ measurement and a SPV measurement. The resultant Q, $V_s$ and SPV curves may be analyzed using non-linear curve fitting and a full quasi-static band bending analysis. Several oxide electrical parameters ($V_{fb}$, $D_{it}$, $T_{ox}$, etc.) discussed above may be extracted from this analysis.

In the COS technique employed in the present invention, mobile charge is pushed and pulled across the oxide. An electric field is applied using corona charge, and heat cycles are performed that are similar to conventional bias temperature stress measurements (200–250° C.). The surface voltage drop that occurs during a heat cycle is directly proportional to the amount of mobile charge in the oxide.

As provided by the present invention, COS techniques can be used to determine generation and recombination lifetimes. The to average time it takes for an electron-hole (e-h) pair to generate is defined as the generation lifetime, and the average time it takes for an e-h pair to recombine is defined as the recombination lifetime. To measure either of these parameters, either a voltage bias or photon bias should be applied. By applying a photon bias and thereby generating an excess of e-h pairs, recombination lifetime can be measured, when the generated excess charge carriers recombine. By applying a voltage bias, a state of deficiency of eh pairs can be created, in which case, the generation lifetime can be measured. In silicon, the recombination rate or the number of carriers recombining per cubic centimeter per second is dominated by Shockely-Read-Hall (SRH) recombination, which means that recombination takes place via defects and impurities. As such, the recombination lifetime is related to SRH recombination rate such that $\tau_R=\Delta n_p/U$, where $\Delta n_p$ is the excess electron concentration (assuming p-type silicon), U is the SRH net recombination rate that is a function of defect concentration and defect energy level and $\tau_R$ is the recombination lifetime.

Two of the more common applications for lifetime measurements are detection of metal contamination and monitoring oxygen precipitation. Metal contamination is a major yield limiting factor in silicon integrated-circuit production. Of all the metal contaminants inhibiting device performance and yields, iron is believed to be one of the most significant. It severely affects oxide integrity by lowering breakdown voltage as a function of iron concentration. It also increases junction leakage currents since iron is a very efficient lifetime killer.

Currently, the methods used most often to make lifetime measurements are SPV, and Pulsed MOS. For iron contamination, the quantity in the surface region tends to hold greater interest than the quantity in the bulk material, since the surface is the most electrically active region for devices. Therefore, results obtained with SPV, which is a bulk measurement technique, may not be adequate. In addition, the pulsed technique correlates well with deep level transient spectroscopy (DLTS). The major draw back of the pulsed MOS technique is the necessity of adding conducting contact processing that is overcome by the pulsed COS technique employed in the present method.

Both pulsed MOS and pulsed COS techniques create a scarcity of charge carrier in the surface region of the wafer. Pulsed MOS uses a voltage applied to the gate of a MOS structure, whereas the pulsed COS method uses corona charge applied to the oxide surface for the same purpose. In the case of pulsed MOS, the resulting surface capacitance is measured as a function of time using a contact probe. Changes in capacitance relate to the surface generation lifetime. In pulsed COS, the surface voltage is measured as a function of time by preferably using a non-contact kelvin probe. The voltage/time relationship is related to capacitance and the surface generation lifetime.

Chip designs require controllable and repeatable current flow that depends heavily on how quickly charges appear and disappear. The charges appear during generation lifetime and disappear during recombination lifetime. Generation lifetime applies when there is a depletion of carriers, which occurs in reverse-biased diode, and carriers have to be created for the device to reach equilibrium. Recombination lifetime applies when there is an excess of carriers, which appear after light illumination, for instance, and carriers have to decay for the device to reach equilibrium. Semiconductors with higher generation lifetime have lower reverse bias leakage, lower CMOS off-state power consumption, longer storage time for memory and higher forward and reverse blocking voltages for power integrated circuits. Similarly higher recombination lifetime yield higher bi-polar transistor turn-off time and higher transfer efficiency for charged-coupled devices. Lifetimes are influenced by all electrically active defects, such as iron or chromium contaminants and structural defects, such as stacking faults. Generation lifetime is sensitive to impurities within the semiconductor, such as copper, gold, zinc, oxygen, iron or cobalt, within 50 mV of midgap. In contrast, recombination lifetime is more sensitive to impurities near band edges within approximately 350 mV of midgap, and they are more sensitive to a wider range of impurities. There are numerous methods for bulk semiconductor lifetime measurements, however, device methods are appropriate for specific regions within a few microns of the semiconductor's surface where the device is fabricated. For $\tau_G$ or $\tau_R$ methods, both the excitation and measurement signals are probed near-surface and are time dependent. Therefore, a pulsed technique is required for these measurements.

Figure 3A:
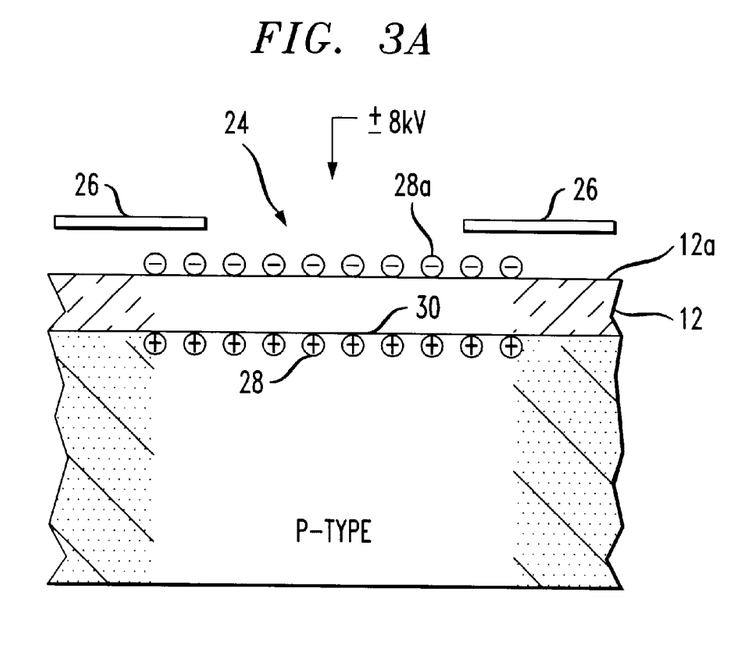
FIG. 3A illustrates a schematic diagram of a cross-sectional view of a semiconductor structure after a corona charging step to accumulate an electrical bias on the semiconductor's surface.
Figure 3B:
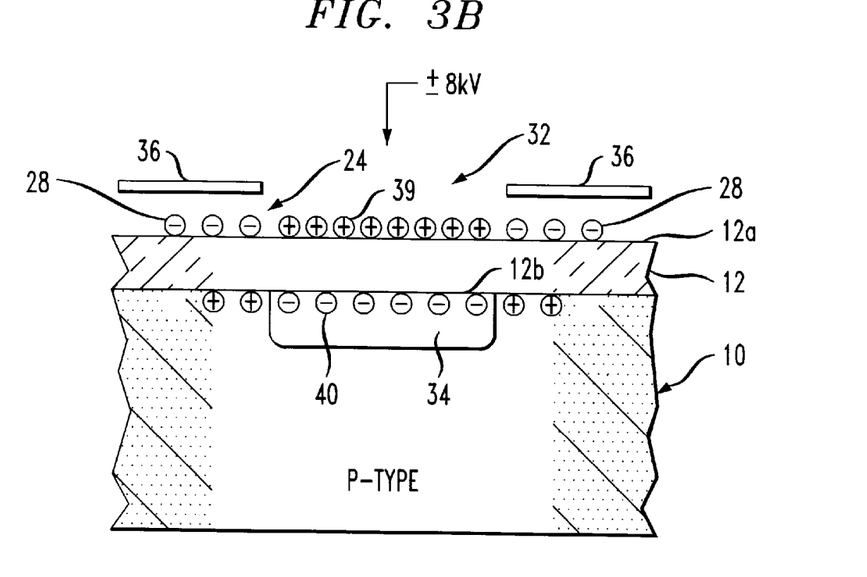
FIG. 3B illustrates a schematic diagram of a cross-sectional view of a semiconductor structure after a corona charging step to invert the silicon dioxide.
Figure 3C:
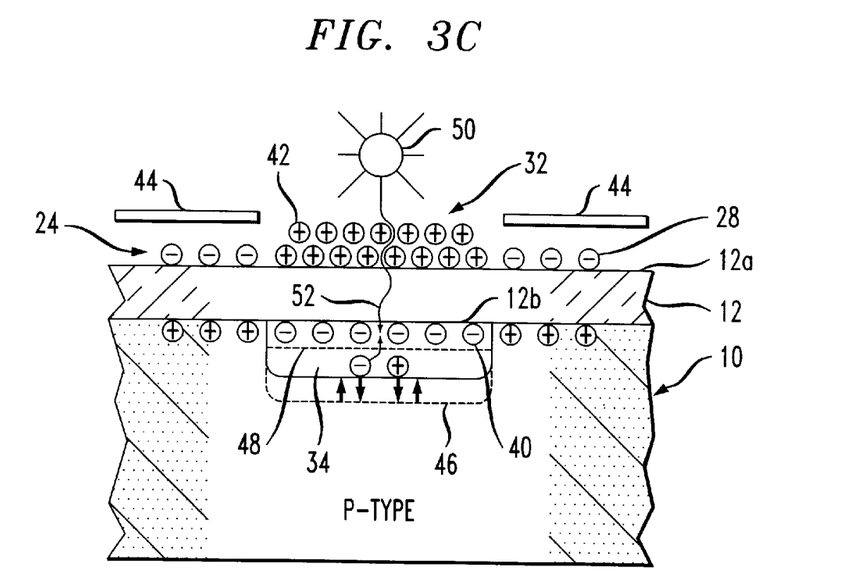
FIG. 3C illustrates a schematic diagram of a cross-sectional view of a semiconductor surface after charging the semiconductor to deep depletion.

Turning now to FIGS. 3A through 3C, charges are deposited on the top surface of the oxide layer 12 to create an inverted surface with a depletion region and a field-induced junction in the semiconductor wafer 10, with an accumulated guard ring on the semiconductor wafer surface. There are a variety of techniques that may be utilized to achieve this type of charge deposition. By way of example only, the above-described charge deposition may be accomplished by means of a corona discharge. In such instances, the first corona discharge may be used to deposit charges on the top surface 12a of the oxide layer 12 in a first area to accumulate a first charged area surface 24. A tungsten needle corona discharge gun may be disposed above the oxide layer 12, with the needle connected to a ±8 kV voltage source. The sign of the ±8 kV voltage source controls the sign of the resultant ionized room ambient gas molecules that will be deposited on the oxide layer surface 12a. For the P-type wafer shown in FIG. 3A, the sign of the voltage source is negative and the resultant negative ionized ambient gas molecules are deposited on the oxide layer surface 12a through the mask 26. In this example, a sufficient number of majority carrier holes 28 (e.g., positive charges) migrate to the surface 30 of the semiconductor 10 in order to image the negative charges 28a on the other side of the oxide layer 12. The result of this first corona discharge is the deposition of the negative charges 28a onto the oxide layer surface 12a.

Turning now to FIG. 3B, the next step in obtaining this charge deposition configuration is to deposit charge by means of a second corona discharge step on the top surface 12a in a second charged area 32 within and surrounded by the first charged area 24 so that it provides an accumulated surface guard ring around the second charged area 32. The second corona discharge creates an inversion region 34 below the second charged area 32.

This second corona discharge step may be accomplished by depositing a corona discharge of opposite sign to the first corona discharge through a second mask 36 that defines the second charged area 32 and that is smaller than the first mask 26. In the example shown in FIG. 3B, the corona discharge comprises positive ionized gas molecules 38 of a sufficient density to neutralize the negative charge deposition in the first charged area 24 and to have a remaining positive charge deposition thereon. Preferably, this second area 32 is concentric with the first area 24.

The result of this second deposition is that the semiconductor wafer 10 immediately acts to image this positive charge 38 by forming the inversion region 34 where holes (the majority carrier in this example) have quickly migrated out it, leaving behind negatively ionized dopant atoms fixed in the lattice in this region. For example, if boron atoms are used as the dopant for a semiconductor wafer of silicon, then those boron atoms fixed in the lattice of the semiconductor wafer in the inversion region 34 with their extra electrons act as a negative image charge for the positive charge 38. If the positive charge 38 is sufficient, then after a period of time, a certain number of electrons migrate to the surface 12b of the semiconductor wafer 10 to form a thin skin of the electrons 40. Accordingly, after a short period of time the positive charge 38 is imaged by this thin skin of electrons 40 on the surface 12b in combination with the fixed dopant atoms in the inversion region 34 with their extra electrons.

The charge configuration shown in FIG. 3B thus comprises an inverted surface 12b on the semiconductor wafer 10 surrounded by an accumulated surface of positive charges 38. The inverted surface 12b has its active energy or surface states filled by the inversion layer electrons.

Turning now to FIG. 3C, there is shown an oxidized semiconductor wafer that has undergone charge deposition in accordance with the present invention. After charge configuration 32 has been created, a further charge positive charge 42 is applied onto the surface 12a directly above the inversion region 34 through a mask 44 to drive the device into deep depletion. As a result, the inversion region 34 increases in depth to a new boundary line 46 to form the deep depletion region. This additional area for the deep depletion region includes a sufficient number of ionized impurities fixed in the semiconductor lattice to provide imaging for the additional positive charge 42. As electrons gradually move to the surface 12b, this enlarged inversion region 42 slowly shrinks from its expanded boundary 46 (referred to as $W_{max}$ in the equations below) to the boundary 48 (referred to as $W_{min}$ in the equations below), which existed before depletion.

If the voltage is measured between the top surface 12a and the bulk of the semiconductor wafer 10, an initial voltage change will be seen with the addition of the charges 42, and this voltage change will slowly decay back to its original voltage from which the generation lifetime may be determined. The return of the induced voltage back to the original voltage can be used to determine a generation lifetime of the semiconductor 10 in a manner as discussed below.

Figure 3D:
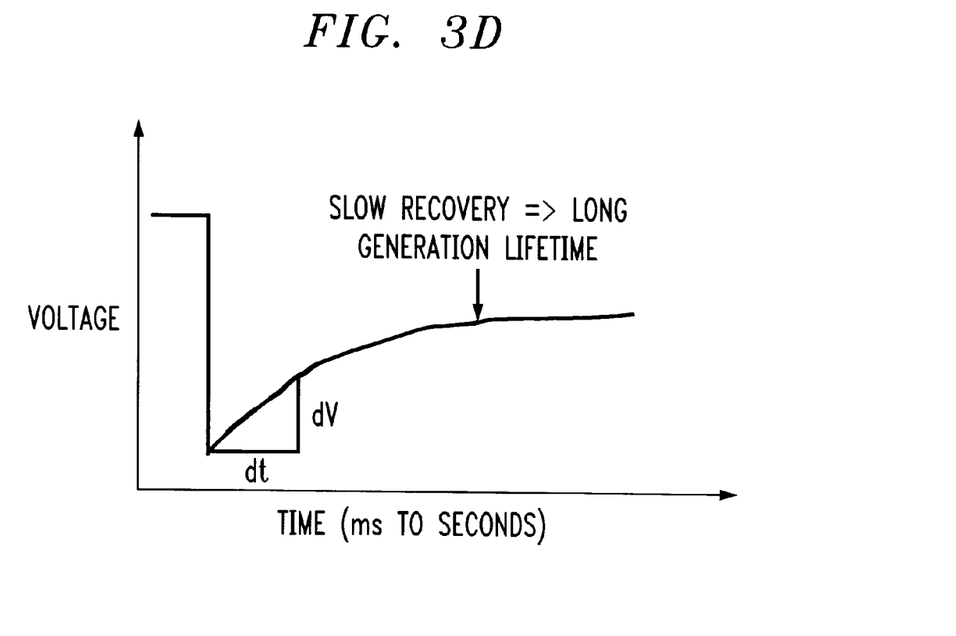
FIG. 3D illustrates a graphical representation of surface voltage as a function of time that forms a generation lifetime curve.

The decay is begun by imposing a forward bias. This forward bias may be imposed by means of a short low intensity pulse from a radiation source 50, such as a light diode. The result of this pulse is that photons 52 propagate through the oxide layer and into the inversion region 34. Photons in the inversion region 34 act to create electron-hole pairs. These electron-hole pairs separate and set up their own electric field, which is opposite to the electric field already present due to the charges at the semiconductor surface 12a. Accordingly, this additional opposite electric field from the electron-hole pairs acts to decrease the total electric field across the inversion region 34. This reduced electric field causes the inversion region 34 to shrink from its extended boundary 46 ($W_{max}$) to its collapsed boundary 48 ($W_{min}$). These electron-hole pairs separate with the electrons moving to the negative electron skin 40 on the surface 12b and the holes moving toward the bottom of the inversion region 34. This change in the total voltage across the depletion region, then decays so that the voltage across the inversion region 34 returns to its original voltage. The speed of this photo-voltage decay is directly proportional to how fast excess photo induced electron-hole pairs recombine in the depletion region. This decay produces a curve that is schematically represented in FIG. 3D, wherein the vertical axis represents surface potential in volts and the horizontal axis represents time in seconds. As illustrated in FIG. 3D, the surface potential V drops down and then begins to recover over dV/dt. A slower recovery of the surface potential indicated a longer the generation lifetime.

Figure 4:
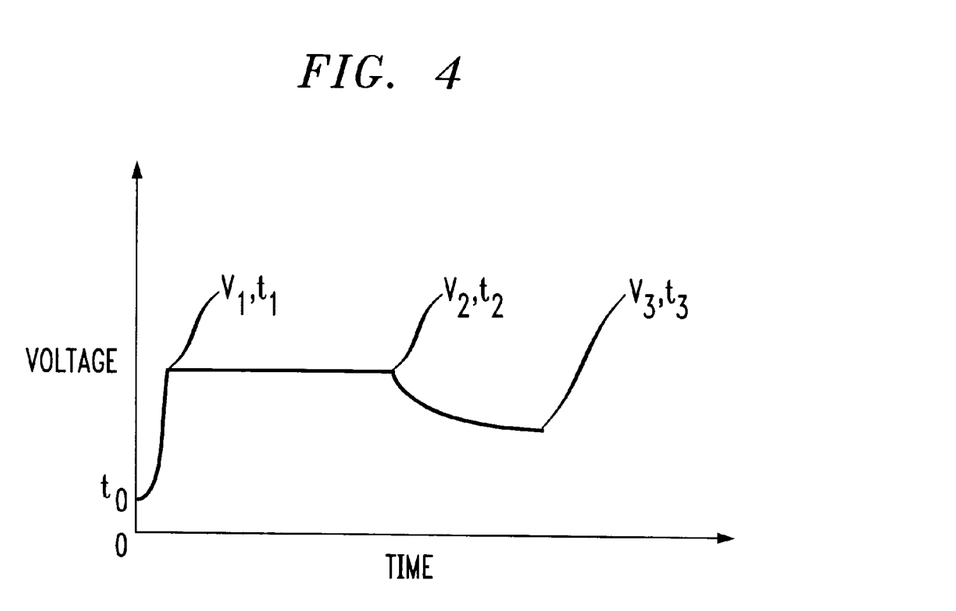
FIG. 4 illustrates a graphical representation of voltage as a function of time that forms a recombination lifetime curve.

This recombination mechanism is indicative of the contaminants in the semiconductor wafer 10 and can be quantitatively determined by calculating the generation lifetime from the following equation.

$$\tau_G = q n_i W_{max}/K_s \in_0 [W_{max} - W_{min}/dV/dt]$$

wherein:
q=electronic charge
n=intrinsic carrier concentration, 1.45 E10/cm$^3$
K=relative dielectric constant
∈=dielectric constant in free space, 8.85×E−14 Farads/cm
V=surface voltage
t=time
$W_{max}$=maximum deep depletion width after the pulse
$W_{min}$=steady state inversion width Turning now to FIG. 4, there is illustrated a curve lifetime wherein the vertical axis represents voltage and the horizontal axis represents time in seconds. This graph illustrates the effects of excess carrier generation from a pulsed light source. When the light source is turned on at $t_0$, voltage increases to $V_1$ at $t_1$. When the light source is turned off at $t_2$, the voltage gradually decreases from $V_2$ at $t_2$ to $V_3$ at $t_3$. These measurements may be determined from non-contact methods, and thus, no test structure is necessary. Moreover, in the COS measurements, the pulse can go to a depth of 1 to 50 μm, unlike MOS pulsing, in which controlled deeper depth is not possible due to breakdown of the oxide. This technique will indicate localized near-surface defects due to processing and contaminations caused by various CMOS processes such as ion implantation, pre-oxidation clean and metallics from plasma etch. Recombination lifetime may be determined from the following equation:

$$\tau_R = n_i/N_{surf} \ln [N_{surf}/n_i] \tau_{RC}$$

wherein:
$n_i$=intrinsic carrier concentration
$N_{surf}$=average near surface dopin
$\tau_{RC}$=RC time constant to reach equilibrium of the photo generated carriers.

Figure 5:
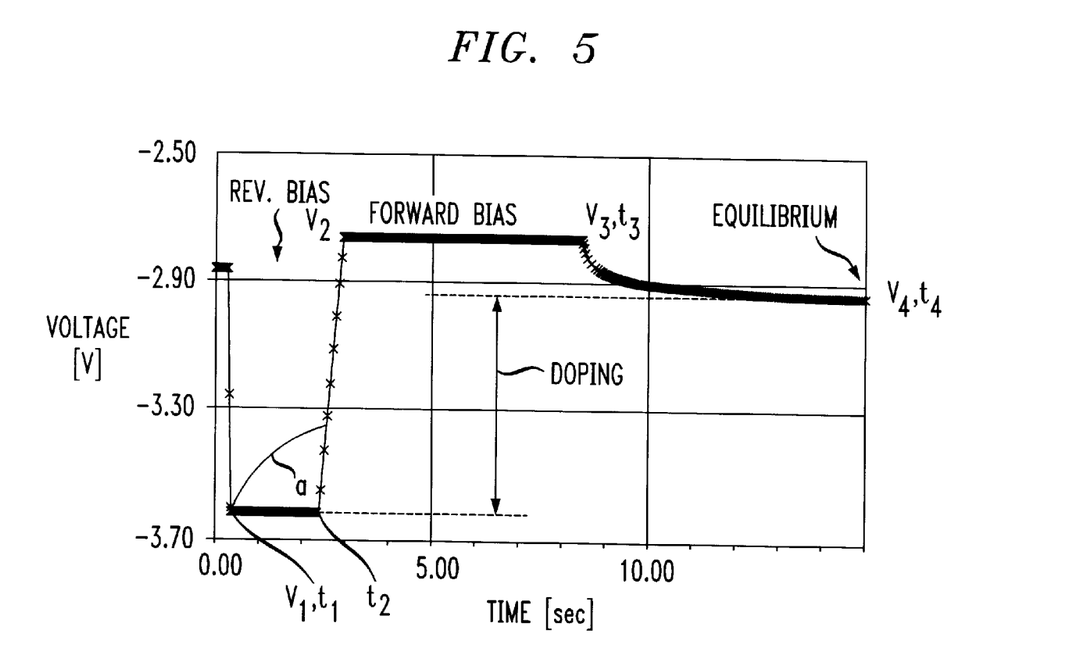
FIG. 5 illustrates a graphical representation of voltage as a function of time that forms a generation and recombination lifetime curve.

FIG. 5 shows $\tau_G$ and $\tau_R$ measurements taken simultaneously on p-type silicon wafer on which a 5 nm gate oxide was grown. The junction is pushed out of equilibrium to deep depletion (reversed bias) in the dark to a voltage of $V_1$ at $t_1$ for about 1 second. Surface voltage transient, which was caused by carrier generation collapsing the depletion region, as indicated by curve "a," was measured by the vibrating kelvin probe. Carrier generations occur near the defects, which is often a result of the metal contaminants. Good silicon often gives $\tau_G$ of about 0.15 to about 1.0 msec. After attaining the recovery curve, which took from about 1 to about 2 seconds, the silicon-silicon dioxide junction was brought back to a forward bias at $V_2$ condition by a low injection LED light pulse of about 632 nm at $t_2$. The light pulse was used to create excess carriers, thereby allowing the junction to equilibrate for about 1 to about 2 seconds before the light was turned off. The voltage decay versus time (from $V_3$ at $t_3$ to $V_4$ at $t_4$ was measured by using a Kelvin probe until equilibrium was attained. The time constant of this decay curve yields $\tau_R$ and the voltage difference at forward and reverse bias equilibrium value yields $N_{surf}$. The above equations were used to determine $\tau_G$, $\tau_R$, and $N_{surf}$, respectively.

Figure 6:
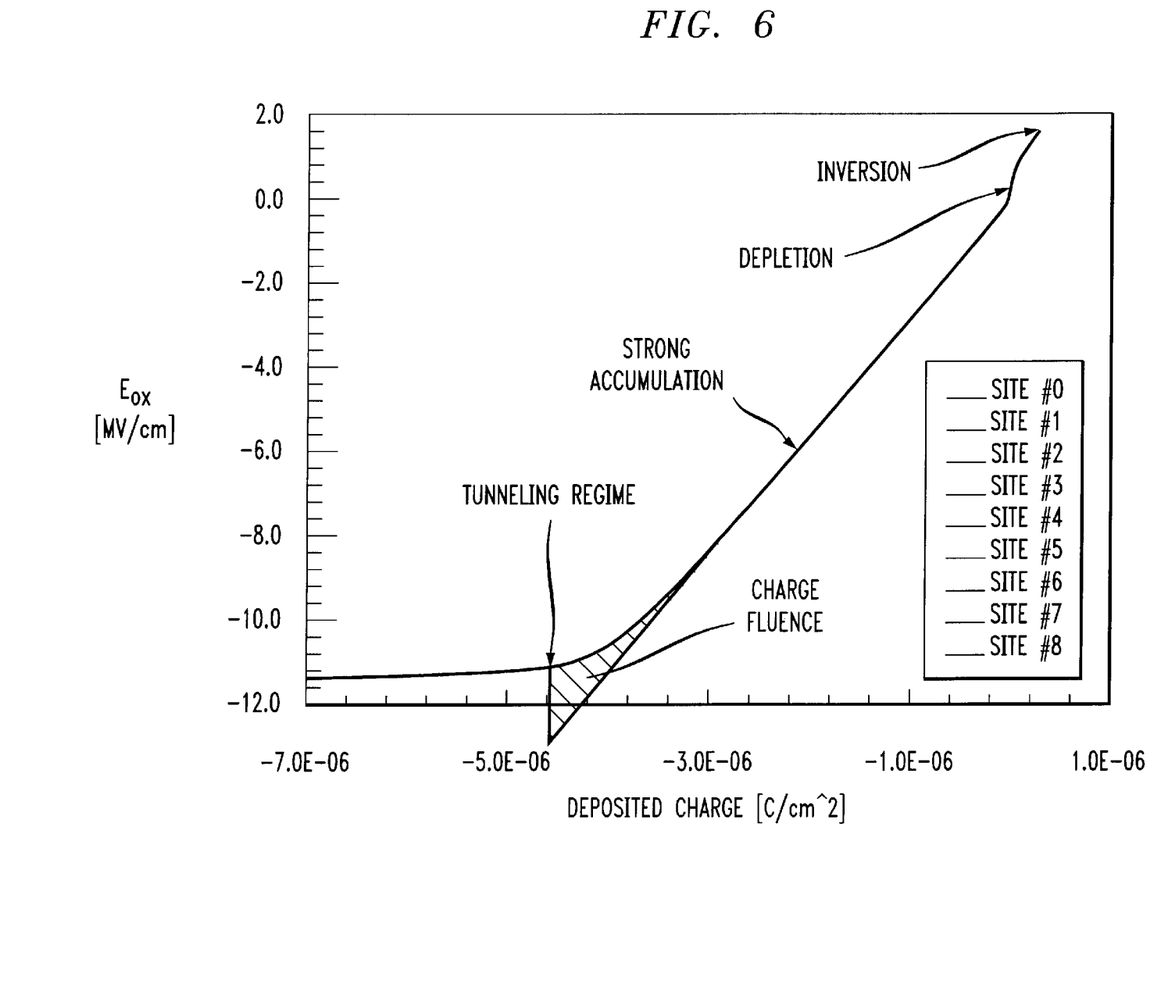
FIG. 6 illustrates a graphical representation of a tunneling field curve.

Turning now to FIG. 6, for conventional charge analysis, a low bias is applied to the sample (±0.5 MV/cm, or ±3E−7 Coul/cm$^2$). The seep is just enough to bias the sample from inversion to accumulation, which is shown in the upper right of FIG. 6. Valuable information can also be gained by analyzing the high-field tunneling behavior of oxides. In this graph, a p-type sample was taken into strong accumulation; the results from 9 sites are overlaid to show the measurement repeatability. The sample was biased through strong accumulation until tunneling began to dissipate the deposited charge (i.e., the tunneling regime). The curve can be analyzed in this tunneling regime to solve for the amount of charge that is flowing through the oxide (the oxide or charge fluence). The maximum voltage or field indicates the resistance of the oxide to tunneling. Bulk oxide impurities can lower $E_{tun}$ by introducing hopping conduction paths in the oxide. This technique was used to successfully detect low-breakdown samples. Also, it has proved useful in the rapid characterization of new ultra-thin oxides.

Figure 7:
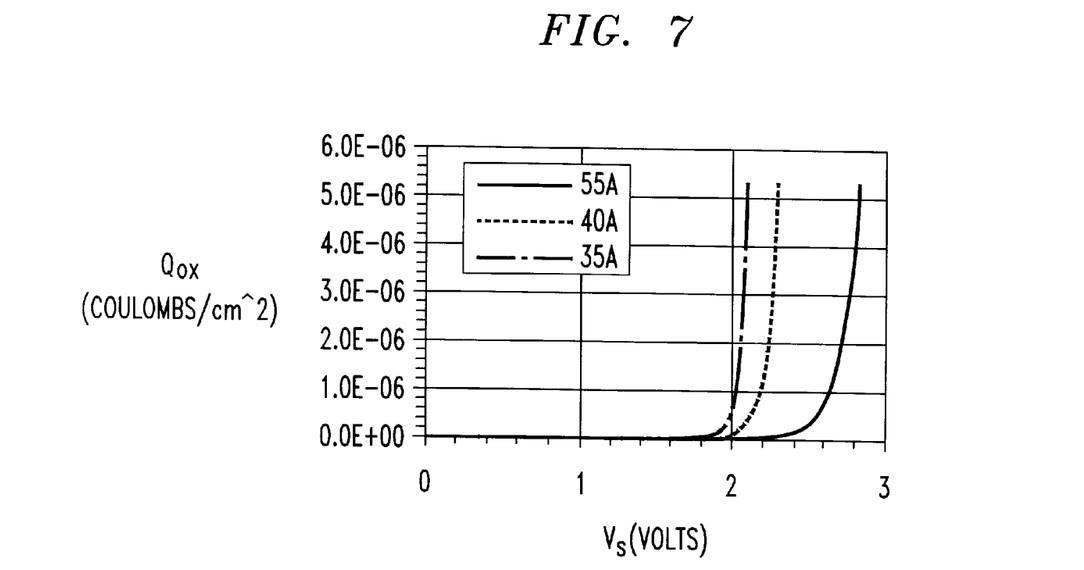
FIG. 7 illustrates a graphical representation of charge Q of the oxide versus the voltage induced in the semiconductor from which the total oxide charge fluence can be determined.

In this application, bias charge densities as high as 9E–6 C/cm² ($E_{max}$=30 MV/cm) are applied in order to induce tunneling. The maximum surface voltage is clamped by the tunneling of carriers through the oxide, and the tunneling field ($E_{tun}$) may be calculated from the following equations:

$$V_{smax} = \Psi_{si} + [\int dQ_{corona}\Theta(V_{tun}-V_{ox})]/C_{ox};$$

when $\Theta(x)\{1: x \geq 0$ and $0: x<0$, then $$E_{tun} = (VS_{max} - \Psi_{si} - WF)/T_{ox}$$

where:

$\Psi_{si}$=voltage drop in Si as band bending in Si
$Q_{corona}$=corona charge
$\Theta$=error function
$V_{tun}$=tunneling voltage
$V_{ox}$=real voltage across the oxide
$C_{ox}$=capacitance of oxide
$V_{smax}$=maximum surface voltage just prior to tunneling
WF=work function
$T_{ox}$=oxide thickness Three gate oxides (5.5, 4.0 and 3.5 nm) for 0.3, 0.25 and 0.18 μm technology respectively were analyzed for their tunneling behavior. These oxides were lightly nitrided thermally grown $SiO_2$ where (1–2%) nitrogen incorporation near the silicon/silicon dioxide interface was achieved through a post oxidation nitrogen oxide ($N_2O$) anneal. It is believed that these oxides have a better than 10% increase in breakdown ($E_{BD}$), tunneling ($E_{tun}$) and wear-out ($Q_{bd}$) behavior than their corresponding thermally grown $SiO_2$ courterparts. FIG. 7 shows their oxide charge fluence ($Q_{ox}$) behaviors. Tunneling field ($E_{tun}$) values obtained from this non-contact COS technique matches very well (within 5%) with the current-ramp MOS capacitor values for these gate oxide thicknesses.

Continuing to refer to FIG. 7, tunneling analysis will now be discussed. The tunneling field plots can be analyzed to determine the total oxide charge fluence (i.e., the amount of charge that actually flows through the oxide during the $E_{tun}$ test). This is done by analyzing the slope of the Q-V curve after the onset of tunneling. Note how low the value of $Q_{ox}$ is 5E-^ is approximately one million time lower than a typical $Q_{bd}$. The onset of tunneling is detected well before catastrophic breakdown. In fact, this test is quite repeatable on robust oxides. Moreover, the same site may be tested repeatedly with little drift. It is believed that this is because the total amount of charge that flows through the oxide is very small therefore, the total oxide damage is also very small. Weaker oxides, however, may show oxide degradation during the test; charges are trapped in the bulk of the oxide or at interfaces. This type of measurement may eventually prove useful for charge trapping measurements in ultrathin oxides. These measurements are also useful for characterizing myriads of tunnel oxides use for nonvolatile memories.

The foregoing has outlined rather broadly the features and technical advantages of the present invention so that those skilled in the art may better understand the detailed description of the invention that follows. Those who are skilled in the art should appreciate that they may readily use the conception and the specific embodiment disclosed as a basis for modifying or designing other structures for carrying out the same purposes of the present invention. Those who are skilled in the art should also realize that such equivalent constructions do not depart from the spirit and scope of the invention in its broadest form.

What is claimed is:

1. A non-contact method for determining electrical properties of a semiconductor material, comprising the steps of:
   field inducing a junction in equilibrium inversion in said semiconductor material;
   pulsing said junction out of equilibrium to create a deep depletion region proximate said junction;
   measuring a surface voltage proximate said junction while performing said step of pulsing; and
   determining generation lifetime of said semiconductor material, said generation lifetime being a function of a rate of change of said surface voltage.

2. The method as recited in claim 1 further comprising the step of bombarding said semiconductor material with photons to collapse said deep depletion region after performing said step of measuring.

3. The method as recited in claim 2 further comprising the steps of measuring a surface photovoltage proximate said junction while performing said step of bombarding and determining a recombination lifetime, said recombination lifetime of said semiconductor material being a function of a rate of change of said surface photovoltage.

4. The method as recited in claim 2 wherein said step of bombarding is performed with a photon source.

5. The method as recited in claim 3 further comprising the step of determining a near-surface doping of said semiconductor material from said recombination lifetime.

6. The method as recited in claim 1 wherein said step of measuring comprises the step of allowing said surface voltage to attain a desired value.

7. The method as recited in claim 1 wherein said semiconductor material is silicon-based.

8. The method as recited in claim 1 wherein said semiconductor material is silicon oxide having a thickness less than 10.0 nm.

9. The method as recited in claim 1 wherein said step of pulsing is performed with a corona source.

10. The method as recited in claim 1 wherein said step of measuring is performed with a Kelvin probe.

11. The method as recited in claim 1 wherein said method further includes the step of:
    determining electrical characteristics using a combination of charge deposition, non-contact voltage measurement and surface photovoltage response to build a quasi-static sweep from inversion to accumulation to measure the said dielectric material selected form the group consisting of:
    charge-trapping,
    hot leakage,
    mobile ion density,
    interface trap density,
    flatband voltage, and
    dielectric thickness.

12. A non-contact method of determining near-surface generation and recombination lifetimes of a semiconductor material, comprising the steps of:
    field inducing a junction in equilibrium inversion in said semiconductor material;
    pulsing said junction out of equilibrium to create a deep depletion region proximate said junction;
    measuring a surface voltage proximate said junction while performing said step of pulsing and determining a generation lifetime of said semiconductor material, said generation lifetime being a function of a rate of change of said surface voltage;
    bombarding said semiconductor material with photons to collapse said deep depletion region after performing said step of measuring;

measuring a surface photovoltage proximate said junction while performing said step of bombarding; and determining a recombination lifetime, said recombination lifetime of said semiconductor material being a function of a rate of change of said surface photovoltage.

13. The method as recited in claim 12 wherein said step of bombarding is performed with a photon source.

14. The method as recited in claim 12 further comprising the step of determining a near-surface doping of said semiconductor material from said recombination lifetime.

15. The method as recited in claim 12 wherein said step of measuring comprises the step of allowing said surface voltage to attain a desired value.

16. The method as recited in claim 12 wherein said semiconductor material is silicon-based.

17. The method as recited in claim 12 wherein said semiconductor material is silicon oxide having a thickness less than 10.0 nm.

18. The method as recited in claim 12 wherein said step of pulsing is performed with a corona source.

19. The method as recited in claim 12 wherein said step of measuring is performed with a Kelvin probe.

20. The method as recited in claim 12 wherein said method further includes the step of:

determining electrical characteristics using a combination of charge deposition, non-contact voltage measurement and surface photovoltage response to build a quasi-static sweep from inversion to accumulation to measure the said dielectric material selected form the group consisting of:
charge-trapping,
hot leakage,
mobile ion density,
interface trap density,
flatband voltage, and
dielectric thickness.

21. A non-contact method for determining high-field tunneling characteristics of a semiconductor material having a dielectric deposited thereon, comprising the steps of:

electrically biasing said semiconductor material to a surface voltage where tunneling begins to dissipate a deposited charge on said semiconductor material; and determining a tunneling voltage of said dielectric from said surface voltage, said tunneling voltage indicating a resistance of said oxide to tunneling.

22. The method as recited in claim 21 wherein the step of determining said tunneling voltage includes allowing said surface voltage to attain a desired value.

23. The method as recited in claim 21 wherein said semiconductor material is silicon-based.

24. The method as recited in claim 21 wherein said semiconductor material is silicon oxide having a thickness less than 15.0 nm.

25. The method as recited in claim 21 wherein said step of electrically biasing includes using a corona source.

26. The method as recited in claim 21 wherein said step of measuring includes using a Kelvin probe to measuring said surface voltage.

27. The method as recited in claim 21 wherein said surface voltage decreases as a function of a charge density of said electrical bias.

28. The method as recited in claim 21 wherein said surface voltage increases overtime during an increase in said electrical bias.

29. The method as recited in claim 21 further comprising the step of determining a charge fluence from said tunneling voltage.

30. The method as recited in claim 21 further comprising the step of determining a field oxide leakage from said tunneling field.

* * * * *